(12) United States Patent
Park

(10) Patent No.: US 12,300,629 B2
(45) Date of Patent: May 13, 2025

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Youngwoo Park, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/204,505

(22) Filed: Jun. 1, 2023

(65) Prior Publication Data
US 2023/0326873 A1    Oct. 12, 2023

Related U.S. Application Data

(63) Continuation of application No. 17/171,708, filed on Feb. 9, 2021, now Pat. No. 11,694,969.

(30) Foreign Application Priority Data

Jun. 18, 2020  (KR) .................. 10-2020-0074531

(51) Int. Cl.
| | |
|---|---|
| *H01L 23/552* | (2006.01) |
| *H01L 21/56* | (2006.01) |
| *H01L 23/528* | (2006.01) |
| *H01L 23/538* | (2006.01) |
| *H01L 25/18* | (2023.01) |

(52) U.S. Cl.
CPC .......... *H01L 23/552* (2013.01); *H01L 21/565* (2013.01); *H01L 23/5286* (2013.01); *H01L 23/5386* (2013.01); *H01L 25/18* (2013.01)

(58) Field of Classification Search
None
See application file for complete search history.

(56) References Cited

U.S. PATENT DOCUMENTS

| | | | |
|---|---|---|---|
| 8,766,429 B2 * | 7/2014 | Kim | ................... H01L 23/552 |
| | | | 257/659 |
| 8,969,136 B2 | 3/2015 | Pagaila | |
| 9,362,235 B2 * | 6/2016 | Kim | ................... H01L 23/552 |
| 9,601,464 B2 | 3/2017 | Chung | |
| 9,721,903 B2 | 8/2017 | Lee et al. | |

(Continued)

FOREIGN PATENT DOCUMENTS

| | | |
|---|---|---|
| KR | 20080004731 | 1/2008 |
| KR | 20090117212 | 11/2009 |

*Primary Examiner* — Long Pham
(74) *Attorney, Agent, or Firm* — MORGAN, LEWIS & BOCKIUS LLP

(57) ABSTRACT

A semiconductor package is disclosed. The semiconductor package may include a substrate, a first semiconductor chip on the substrate, an inner mold layer provided on the substrate to at least partially enclose the first semiconductor chip, an inner shielding layer provided on the substrate to at least partially enclose the inner mold layer, a second semiconductor chip stack on the inner shielding layer, an outer mold layer provided on the substrate to at least partially enclose the inner shielding layer and the second semiconductor chip stack, and an outer shielding layer at least partially enclosing the outer mold layer. Each of the inner and outer shielding layers may include a conductive material, and the inner shielding layer may be electrically connected to a ground pad of the substrate.

7 Claims, 15 Drawing Sheets

(56) References Cited

U.S. PATENT DOCUMENTS

| | | |
|---|---|---|
| 2009/0014847 A1 | 1/2009 | Chen et al. |
| 2011/0304015 A1* | 12/2011 | Kim .................... H01L 25/0657 |
| | | 257/532 |
| 2012/0228751 A1 | 9/2012 | Song |
| 2014/0151859 A1* | 6/2014 | Kim ...................... H01L 25/105 |
| | | 257/659 |
| 2015/0130078 A1* | 5/2015 | Hong .................... H01L 23/367 |
| | | 257/774 |
| 2018/0090448 A1 | 3/2018 | Kim |
| 2019/0341352 A1 | 11/2019 | We et al. |
| 2021/0398912 A1 | 12/2021 | Park |

* cited by examiner

FIG. 15
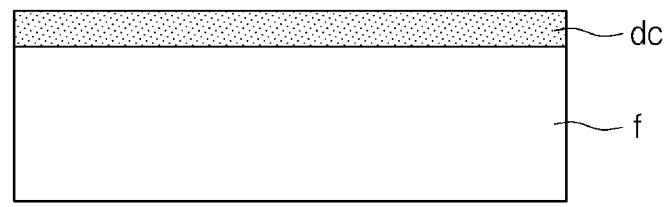
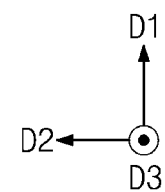
FIG. 16
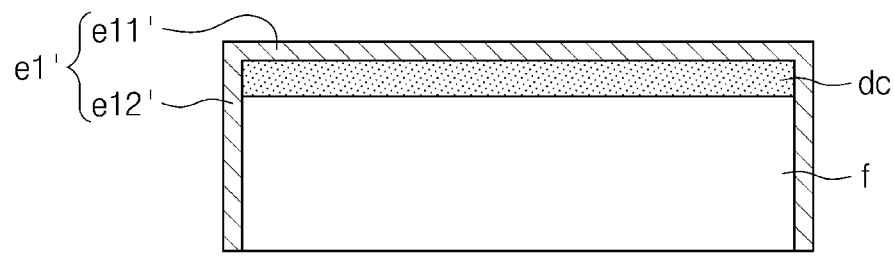
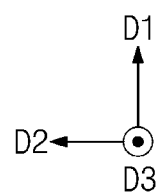

SEMICONDUCTOR PACKAGE AND METHOD OF FABRICATING THE SAME

CROSS-REFERENCE TO RELATED APPLICATIONS

This application is a continuation of U.S. patent application Ser. No. 17/171,708 filed on Feb. 9, 2021, which claims priority under 35 U.S.C. § 119 to Korean Patent Application No. 10-2020-0074531, filed on Jun. 18, 2020, in the Korean Intellectual Property Office, the disclosures of which are incorporated by reference herein.

TECHNICAL FIELD

The present disclosure relates to a semiconductor package and a method of fabricating the same. More particularly, the present disclosure relates to a semiconductor package blocking electromagnetic waves and a method of fabricating the same.

DISCUSSION OF RELATED ART

A semiconductor package is configured to use a semiconductor chip as a part of an electronic product. In some cases, the semiconductor package includes a substrate, such as a printed circuit board (PCB), and a semiconductor chip mounted thereon. A plurality of semiconductor chips are mounted in each semiconductor package. The semiconductor chips are provided to have various functions. The semiconductor chips are stacked on a single substrate. Each semiconductor chip emits electromagnetic waves, which may cause a noise issue in another semiconductor chip. This noise caused by the electromagnetic waves may lead to malfunction of the semiconductor chip

SUMMARY

According to an embodiment of the inventive concept, a semiconductor package includes: a substrate; a first semiconductor chip on the substrate; an inner mold layer provided on the substrate, wherein the inner mold layer at least partially encloses the first semiconductor chip; an inner shielding layer provided on the substrate, wherein the inner shielding layer at least partially encloses the inner mold layer; a second semiconductor chip stack on the inner shielding layer; an outer mold layer provided on the substrate, wherein the outer mold layer at least partially encloses the inner shielding layer and the second semiconductor chip stack; and an outer shielding layer at least partially enclosing the outer mold layer, wherein each of the inner and outer shielding layers includes a conductive material, and the inner shielding layer is electrically connected to the substrate by a ground pad.

According to an embodiment of the inventive concept, a semiconductor package includes: a substrate; a first semiconductor chip on the substrate; an adhesion portion at least partially enclosing the first semiconductor chip; a supporting layer on the adhesion portion; an inner shielding layer at least partially enclosing the adhesion portion and the supporting layer; a second semiconductor chip on the inner shielding layer; an outer mold layer at least partially enclosing the inner shielding layer and the second semiconductor chip; and an outer shielding layer at least partially enclosing the outer mold layer, wherein each of the inner and outer shielding layers includes a conductive material, the inner shielding layer is electrically connected to the substrate by a ground pad, and the first semiconductor chip includes a semiconductor chip of a different type from the second semiconductor chip.

According to an embodiment of the present concept, a method of fabricating a semiconductor package includes: disposing a first semiconductor chip on a substrate; forming an inner shielding layer; disposing a second semiconductor chip stack on the inner shielding layer; forming an outer mold layer on the substrate to at least partially enclose the inner shielding layer and the second semiconductor chip stack; and forming an outer shielding layer to at least partially enclose the outer mold layer, wherein each of the inner and outer shielding layers includes a conductive material, and the inner shielding layer is formed on the substrate to at least partially enclose the first semiconductor chip and is electrically connected to the substrate by a ground pad.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 15 to 18 are cross-sectional views sequentially illustrating fabricating steps in the method of FIG. 14.

DETAILED DESCRIPTION

Example embodiments of the inventive concepts will now be described more fully with reference to the accompanying drawings, in which example embodiments are shown.

Figure 1A:
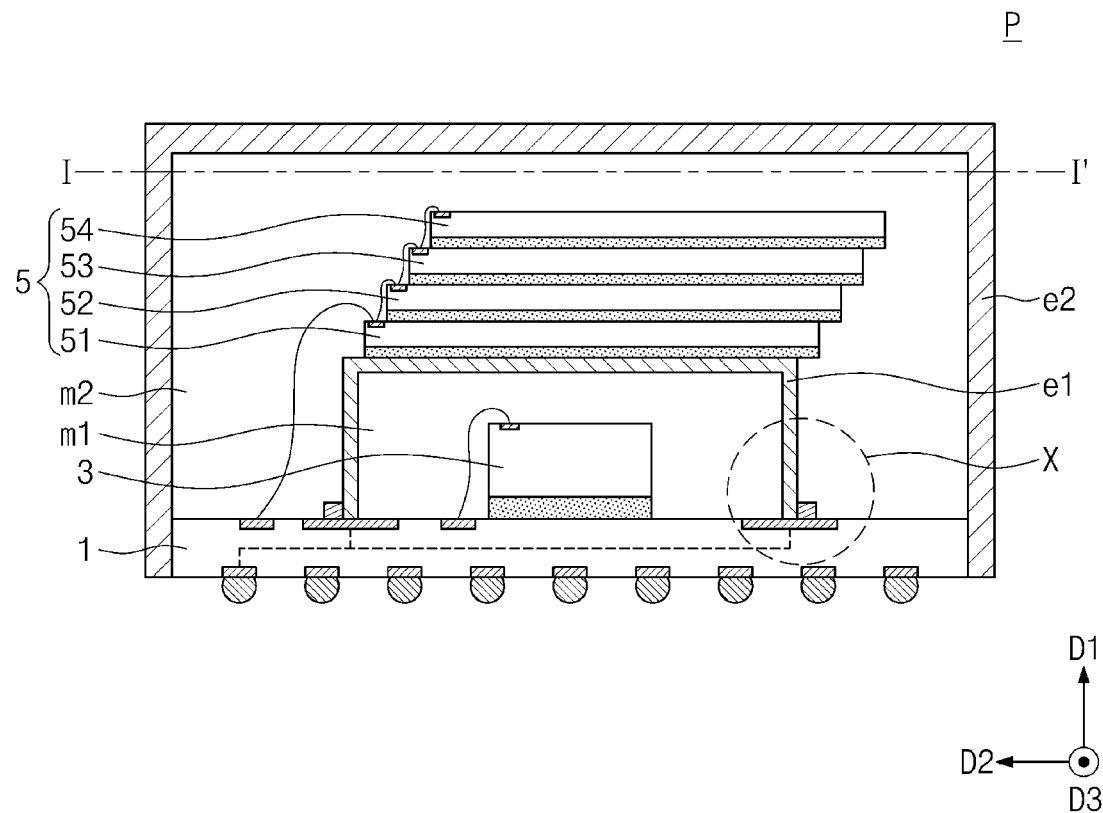
FIG. 1A is a cross-sectional view illustrating a semiconductor package according to an embodiment of the inventive concept.
Figure 1B:
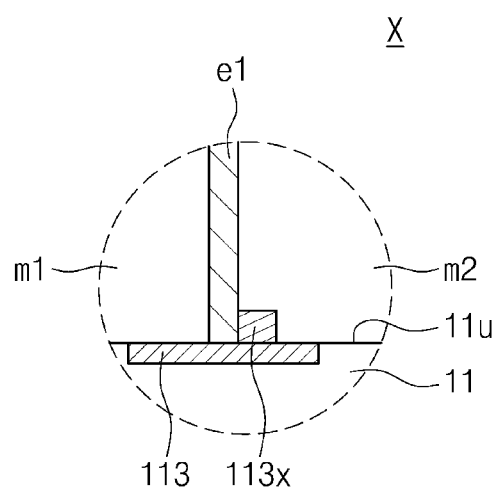
FIG. 1B is an enlarged cross-sectional view illustrating a portion X of FIG. 1A.
Figure 2:
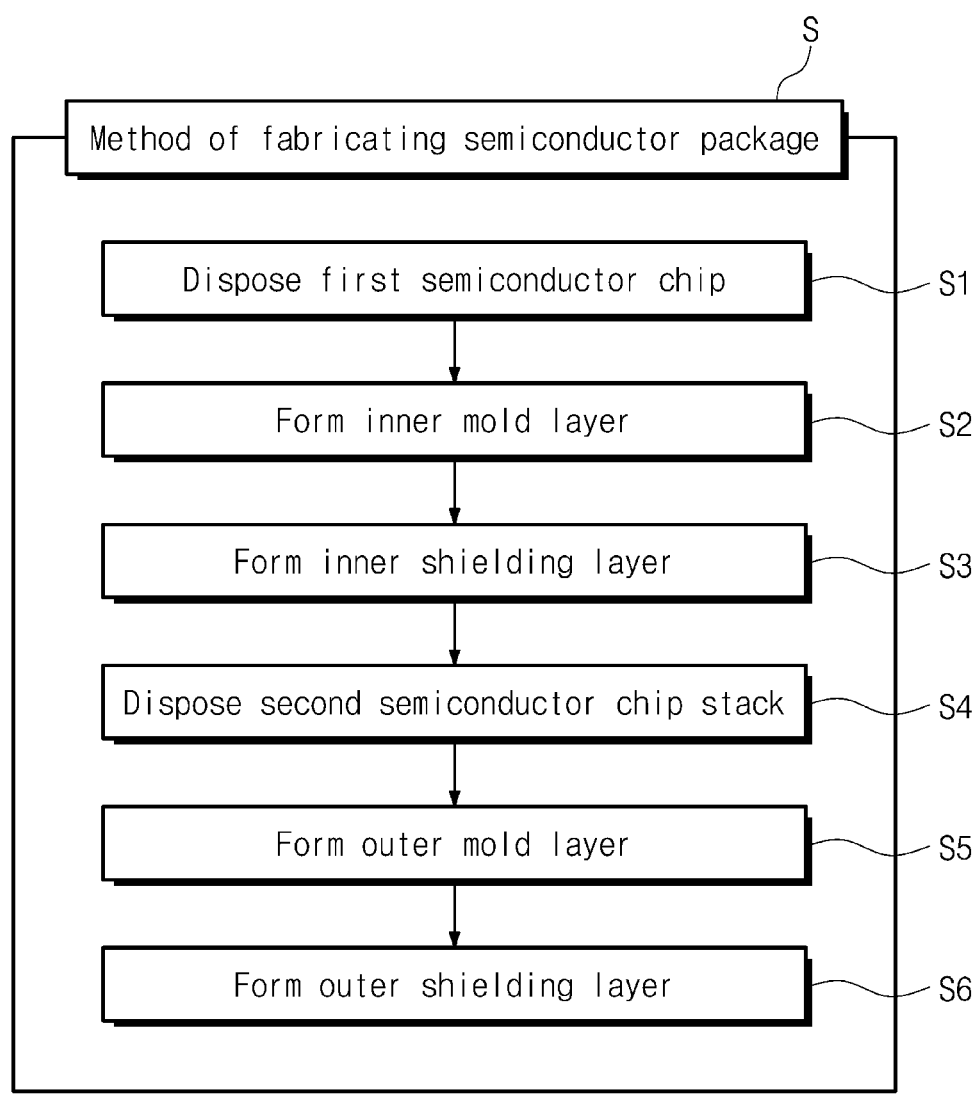
FIG. 2 is a plan view illustrating elements of the semiconductor package of FIG. 1A, placed below a line I-I'.

FIG. 1A is a cross-sectional view illustrating a semiconductor package according to an embodiment of the inventive concept, FIG. 1B is an enlarged cross-sectional view illustrating a portion X of FIG. 1A, and FIG. 2 is a plan view illustrating elements of the semiconductor package of FIG. 1A, placed below a line I-I'.

Hereinafter, three directions D1, D2, and D3 depicted in FIG. 1A will be referred to as a first direction, a second direction, and a third direction, respectively. The third direction D3 may be substantially perpendicular to both of the first and second directions D1 and D2.

When components are described or shown to be "in contact" with each other, this contact may be physical contact, electrical contact, or both, unless otherwise specified.

Referring to FIG. 1A, a semiconductor package P may include a substrate 1, a first semiconductor chip 3, an inner mold layer m1, an inner shielding layer e1, a second semiconductor chip stack 5, an outer mold layer m2, and an outer shielding layer e2.

The substrate 1 may be configured to connect a semiconductor chip in the semiconductor package P to another component on the outside of the semiconductor package P. For example, the substrate 1 may electrically connect the first semiconductor chip 3 and the second semiconductor chip stack 5 to the outside of the semiconductor package P. The substrate 1 may include a printed circuit board (PCB) or the like. However, the inventive concept is not necessarily limited to this example, and the substrate 1 may mean a redistribution layer (RDL) or the like. The substrate 1 will be described in more detail with reference to FIG. 4.

The first semiconductor chip 3 may be placed on the substrate 1. The first semiconductor chip 3 may be electrically connected to the substrate 1. The first semiconductor chip 3 may be electrically connected to the substrate 1 in various manners. For example, the first semiconductor chip 3 may be electrically connected to the substrate 1 through wires or the like, as shown in FIG. 1. However, the inventive concept is not necessarily limited to this example, and the first semiconductor chip 3 may be electrically connected to the substrate 1 in a flip-chip manner. In this case, the first semiconductor chip 3 may be provided in such a way that its active surface is oriented downwardly to face a top surface of the substrate 1. The first semiconductor chip 3 may include a non-memory semiconductor. For example, the first semiconductor chip 3 may include a logic chip. The first semiconductor chip 3 may control the second semiconductor chip stack 5. For example, the first semiconductor chip 3 may be used as a master chip with respect to the second semiconductor chip stack 5. The first semiconductor chip 3 may include more input/output (I/O) terminals than the second semiconductor chip stack 5. In an embodiment, there may be more wires connected to the first semiconductor chip 3 than to the second semiconductor chip stack 5. An intensity of electromagnetic waves emitted from the first semiconductor chip 3 may be higher than that from the second semiconductor chip stack 5.

The inner mold layer m1 may at least partially enclose the first semiconductor chip 3. For example, the inner mold layer m1 may be provided on the substrate 1 to at least partially enclose the first semiconductor chip 3. For example, the inner mold layer m1 may cover top and side surfaces of the first semiconductor chip 3. The inner mold layer m1 may protect the first semiconductor chip 3 from external impact and/or heat. The inner mold layer m1 may be formed of or include an insulating material. For example, the inner mold layer m1 may be formed of or include an epoxy molding compound (EMC). When measured in the second and third directions D2 and D3, lengths of the inner mold layer m1 may be smaller than those of the substrate 1.

The inner shielding layer e1 may at least partially enclose the inner mold layer m1. For example, the inner shielding layer e1 may be provided on the substrate 1 to at least partially enclose the inner mold layer m1. For example, the inner shielding layer e1 may cover top and side surfaces of the inner mold layer m1. In an embodiment, the inner shielding layer e1 may be thick enough to achieve a desired shielding effect. For example, the inner shielding layer e1 may have a thickness of 3 µm or thicker. In an embodiment, the thickness of the inner shielding layer e1 may range from 6 µm to 10 µm. However, the inventive concept is not necessarily limited to this example, and the thickness for the shielding of the electromagnetic waves may be chosen depending on design rules in use. The inner shielding layer e1 may be formed of or include a conductive material. For example, the inner shielding layer e1 may be formed of or include at least one of copper (Cu), silver (Ag), or the like. The inner shielding layer e1 may be formed of a thermally conductive and electrically conductive material. The inner shielding layer e1 may be grounded through the substrate 1. This will be described in more detail with reference to FIG. 1B. The inner shielding layer e1 may shield electromagnetic waves generated from components covered with the inner shielding layer e1. For example, the inner shielding layer e1 may shield electromagnetic waves generated from the first semiconductor chip 3. Thus, it may be possible to prevent electromagnetic waves generated from the first semiconductor chip 3 from interfering with an element placed outside of the inner shielding layer e1.

The second semiconductor chip stack 5 may be placed on the inner shielding layer e1. The second semiconductor chip stack 5 may include at least one semiconductor chip that is of a kind different from the first semiconductor chip 3. For example, the second semiconductor chip stack 5 may include at least one memory chip. In an embodiment, the second semiconductor chip stack 5 may include a plurality of memory chips. For example, the second semiconductor chip stack 5 may include a first memory semiconductor chip 51, a second memory semiconductor chip 52, a third memory semiconductor chip 53, and a fourth memory semiconductor chip 54. However, the number of the memory semiconductor chips in the second semiconductor chip stack 5 is not limited to four, and in an embodiment, the second semiconductor chip stack 5 may include two, three, or at least five memory semiconductors. In an embodiment, each of the memory semiconductor chips may be larger than the first semiconductor chip 3. For example, a surface area of the memory semiconductor chip may be larger than that of the first semiconductor chip 3. For example, a length of the memory semiconductor chip in the second direction D2 may be larger than that of the first semiconductor chip 3 in the second direction D2. Also, a length of the memory semiconductor chip in the third direction D3 may be larger than that of the first semiconductor chip 3 in the third direction D3. The first semiconductor chip 3 may be provided in such a way that more circuits are integrated within a given area. The memory semiconductor chips may be vertically stacked. For example, the memory semiconductor chips may be stacked to form a stepwise shape. In this case, a portion of the active surface of each memory semiconductor chip may be exposed outside the other memory semiconductor chips. The second semiconductor chip stack 5 may be electrically connected to the substrate 1. For example, the second semiconductor chip stack 5 may be electrically connected to the substrate 1 through wires or the like, as shown in FIG. 1. The second semiconductor chip stack 5 may be controlled by the first semiconductor chip 3. For example, the second semiconductor chip stack 5 may be used as a slave chip with respect to the first semiconductor chip 3. An intensity of electromagnetic waves emitted from the second semiconductor chip stack 5 may be lower than that from the first semiconductor chip 3.

The outer mold layer m2 may at least partially enclose the inner shielding layer e1 and/or the second semiconductor chip stack 5. For example, the outer mold layer m2 at least partially enclose the inner shielding layer e1 and/or the second semiconductor chip stack 5. For example, the outer mold layer m2 may cover side and top surfaces of the inner shielding layer e1 and cover side and top surfaces of the second semiconductor chip stack 5. The outer mold layer m2 may protect the inner shielding layer e1 and/or the second semiconductor chip stack 5 from external impact and/or heat. The outer mold layer m2 may be formed of or include an insulating material. For example, the outer mold layer m2 may be formed of or include an epoxy molding compound (EMC).

The outer shielding layer e2 may at least partially enclose the outer mold layer m2. For example, the outer shielding layer e2 may cover side and top surfaces of the outer mold layer m2. In an embodiment, the outer shielding layer e2 may extend to cover a side surface of the substrate 1. The outer shielding layer e2 may be formed of or include a conductive material. For example, the outer shielding layer e2 may be formed of or include at least one of copper (Cu), silver (Ag), or the like. The outer shielding layer e2 may be grounded. For example, the outer shielding layer e2 may be grounded through a motherboard or the like. The outer shielding layer e2 may shield electromagnetic waves generated from components covered with the outer shielding layer e2. For example, the outer shielding layer e2 may shield electromagnetic waves generated from the second semiconductor chip stack 5. Thus, it may be possible to prevent an element outside the outer shielding layer e2 from being interfered with the electromagnetic waves generated from the second semiconductor chip stack 5.

Referring to FIG. 1B, the inner shielding layer e1 may be in contact with a ground pad 113, which is not obscured by a top surface 11u of a substrate body 11. The inner shielding layer e1 may be electrically connected or physically connected to the ground pad 113. For example, the inner shielding layer e1 may be grounded through the ground pad 113. The ground pad 113 may be electrically connected to an outer ground pad 133, which is disposed on a bottom surface 11b of the substrate 1 and is exposed to the outside (e.g., see FIG. 4). The outer ground pad 133 may be grounded to an external ground terminal through a ground ball 133s (e.g., see FIG. 4). Thus, the inner shielding layer e1 may be also grounded to the external ground terminal through the ground ball 133s. This will be described in more detail with reference to FIG. 4. The ground pad 113 may be extended to form a rectangular band shape on the substrate 1, when viewed in a plan view. For example, the ground pad 113 may be provided to have a closed rectangular shape on a plane that is defined by the second and third directions D2 and D3.

In an embodiment, a ground dam 113x may be further provided on the ground pad 113. The ground dam 113x may be formed of or include a conductive material. For example, the ground dam 113x may be formed of or include copper (Cu) or the like. The ground dam 113x may be formed by various methods. For example, the ground dam 113x may be formed by a deposition process or a spray process using a mask. The ground dam 113x may be in contact with a top surface of the ground pad 113. The ground dam 113x may be electrically connected to the ground pad 113. Lengths of the ground dam 113x may be smaller than those of the ground pad 113, when measured in the second and third directions D2 and D3. Thus, even when the ground dam 113x is placed on the ground pad 113, a portion of the ground pad 113 may be exposed. The ground dam 113x may be in contact with the inner shielding layer e1. For example, an inner side surface of the ground dam 113x may be in contact with the side surface of the inner shielding layer e1. The ground dam 113x may be electrically connected to the inner shielding layer e1. Due to the presence of the ground dam 113x, a contact area between the inner shielding layer e1 and other elements electrically connected thereto may be increased. In some embodiments, the contact area between the inner shielding layer e1 and other conductive material may include both a contact area between the bottom surface of the inner shielding layer e1 and the ground pad 113, as well as a contact area between the side surface of the inner shielding layer e1 and the ground dam 113x. Thus, the inner shielding layer e1 may provide increased grounding. In an embodiment, the ground dam 113x may at least partially enclose the inner shielding layer e1; this may be apparent when viewed in a plan view. Accordingly, a lower portion of the side surface of the inner shielding layer e1 may be in contact with the ground dam 113x on all sides extending in the first direction.

Referring to FIG. 2, the substrate 1 may have a rectangular shape. All of the inner shielding layer e1, the outer shielding layer e2, the first semiconductor chip 3, and the second semiconductor chip stack 5 may have a rectangular shape. When viewed in a plan view, an area of the first semiconductor chip 3 may be smaller than that of the second semiconductor chip stack 5.

In a semiconductor package according to an embodiment of the inventive concept, an inner shielding layer may be provided to at least partially enclose a first semiconductor chip and an inner mold layer. Thus, it may be possible to prevent electromagnetic waves generated from the first semiconductor chip from being leaked to the outside. For example, electromagnetic interference (EMI) caused by the electromagnetic waves from the first semiconductor chip may be prevented. For example, EMI may be prevented between the first semiconductor chip and a second semiconductor chip, which is placed outside the inner shielding layer. Since EMI between semiconductor chips in a package is prevented, the package may have improved Signal Integrity/Power Integrity (SI/PI) properties. In the case where the first semiconductor chip includes a logic chip, the first semiconductor chip may emit relatively intense electromagnetic waves. The first semiconductor chip may have a relatively small area and relatively many I/O terminals. Thus, the electromagnetic waves emitted from the first semiconductor chip may be relatively intense. However, since the inner shielding layer is provided to at least partially enclose the first semiconductor chip, a substantial portion of the electromagnetic waves may be prevented from being emitted to the outside of the inner shielding layer. This means that the inner shielding layer may be more effective, when the first semiconductor chip includes a logic chip.

In a semiconductor package according to an embodiment of the inventive concept, an inner shielding layer may be provided to block electromagnetic waves generated from a first semiconductor chip, and thus, even when there is a scratch on an outer appearance of the semiconductor package, it may be possible to effectively prevent EMI caused by the electromagnetic waves from the first semiconductor chip. For example, even when an outer shielding layer is damaged by the scratch on the semiconductor package, it may be possible to prevent EMI caused by the first semiconductor chip. As a result, the semiconductor package may have a low failure ratio and an improved production yield.

Figure 3:
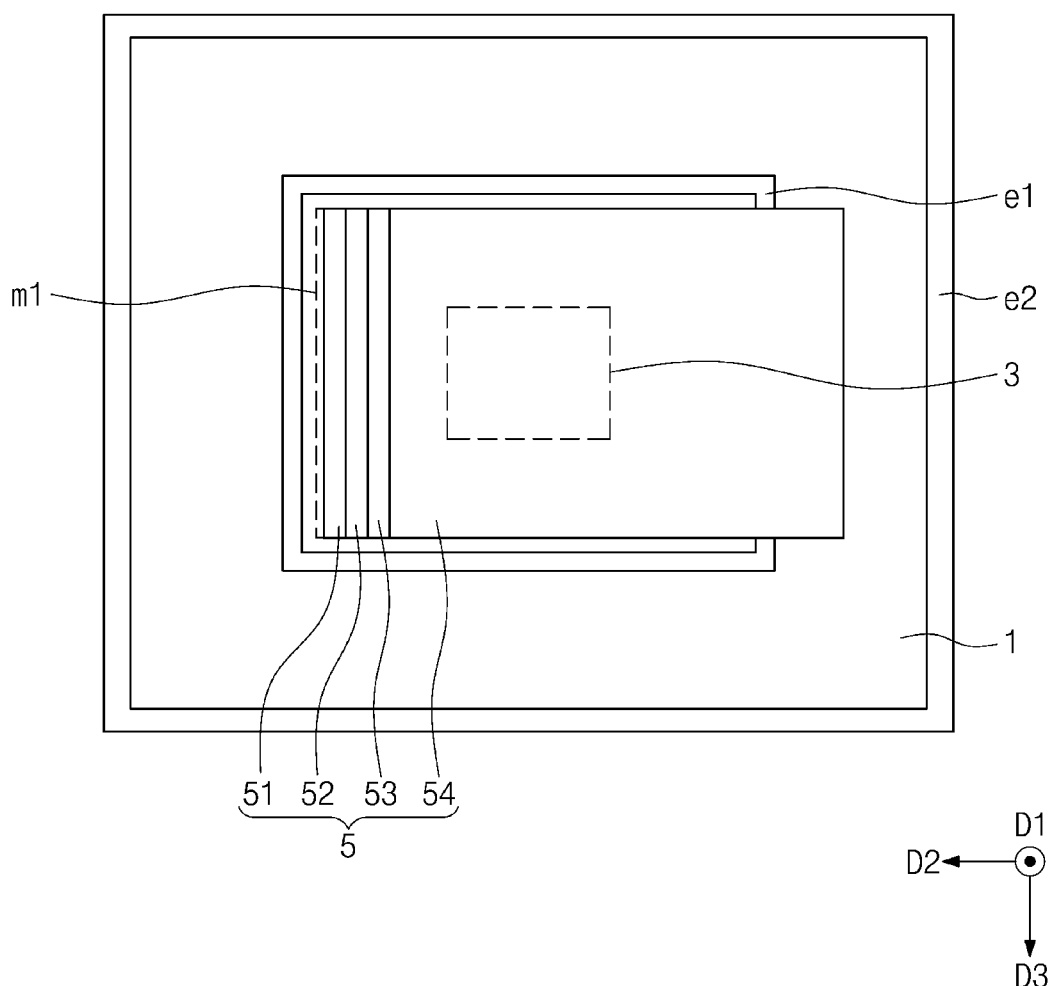
FIG. 3 is a flow chart illustrating a method of fabricating a semiconductor package, according to an embodiment of the inventive concept.

FIG. 3 is a flow chart illustrating a method of fabricating a semiconductor package, according to an embodiment of the inventive concept.

Referring to FIG. 3, a method S may be provided to fabricate a semiconductor package. The method S may include disposing a first semiconductor chip (in S1), forming an inner mold layer (in S2), forming an inner shielding layer (in S3), disposing a second semiconductor chip stack (in S4), forming an outer mold layer (in S5), and forming an outer shielding layer (in S6). Hereinafter, each step of the method S will be described in more detail with reference to FIGS. 4 to 12.

FIGS. 4 to 12 are cross-sectional views sequentially illustrating fabricating steps in the method of FIG. 3.

Figure 4:
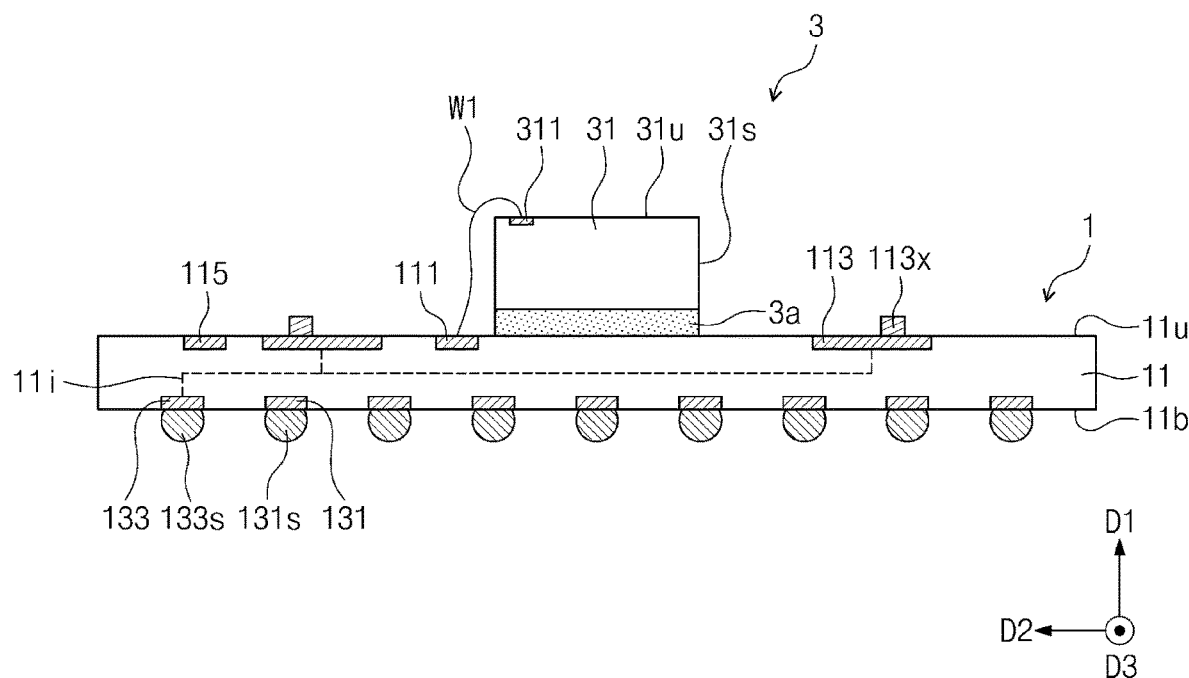
FIGS. 4 to 12 are cross-sectional views sequentially illustrating fabricating steps in the method of FIG. 3.

Referring to FIG. 4, the substrate 1 may include the ground pad 113, a first connection pad 111, and a second connection pad 115, which are provided on a top exterior surface 11*u* of the substrate 1. The substrate 1 may further include the outer ground pad 133 and an outer connection pad 131, which are provided on the bottom exterior surface 11*b* of the substrate 1. The outer ground pad 133 may be bonded to the ground ball 133*s*. The ground ball 133*s* may be grounded to an external ground terminal. The outer ground pad 133 may be electrically connected to the ground pad 113 through a ground line 11*i*. The first connection pad 111 and the second connection pad 115 may be electrically connected to the outer connection pad 131.

Referring to FIGS. 3 and 4, disposing of the first semiconductor chip (step S1 of FIG. 2) may include bonding the first semiconductor chip 3 to the substrate 1. The first semiconductor chip 3 may be electrically connected to the substrate 1. For example, the first semiconductor chip 3 may be electrically connected to the substrate 1 through wires or the like. The first semiconductor chip 3 may be bonded to the top surface 11*u* of the substrate 1 by a first semiconductor chip bonding layer 3*a*. The first semiconductor chip 3 may include a first chip pad 311, which is exposed on a top surface 31*u* of a body 31. The first chip pad 311 may be electrically connected to the first connection pad 111 through a first wire WI. However, the inventive concept is not necessarily limited to this example, and the first semiconductor chip 3 may be electrically connected to the substrate 1 in a flip-chip manner.

Figure 5:
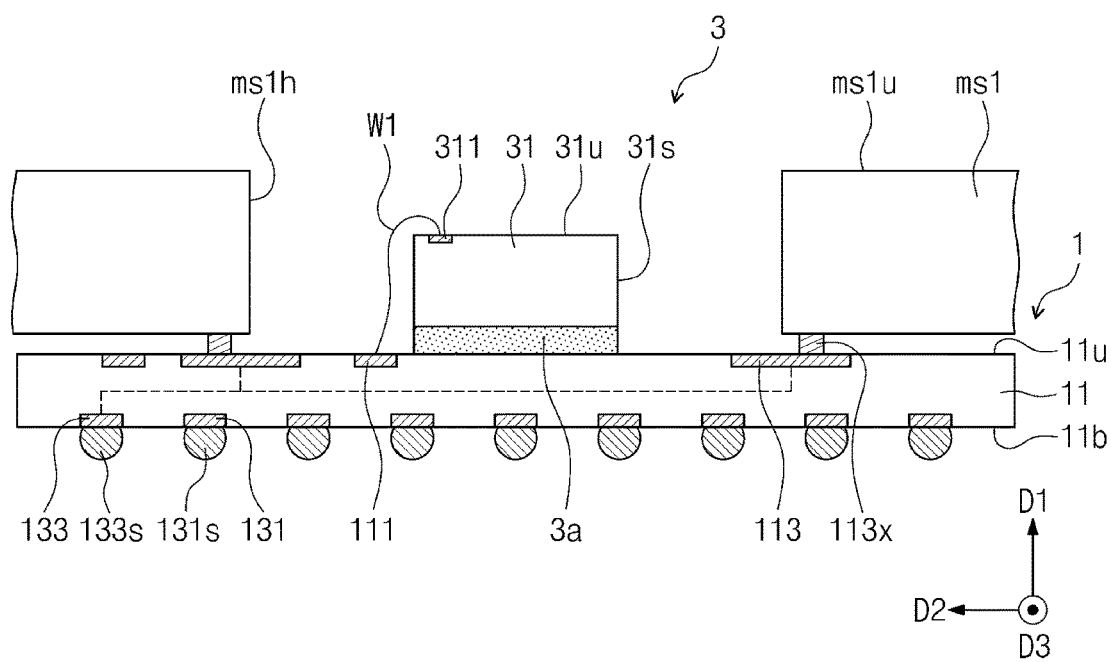

Referring to FIGS. 3 and 5, the forming of the inner mold layer (in S2) may include disposing a first mask ms1 on the substrate 1. The first mask ms1 may be formed to have a first mask hole ms1*h*. The first mask ms1 may be disposed on the substrate 1 such that the first semiconductor chip 3 is within the first mask hole ms1*h*.

Figure 6:
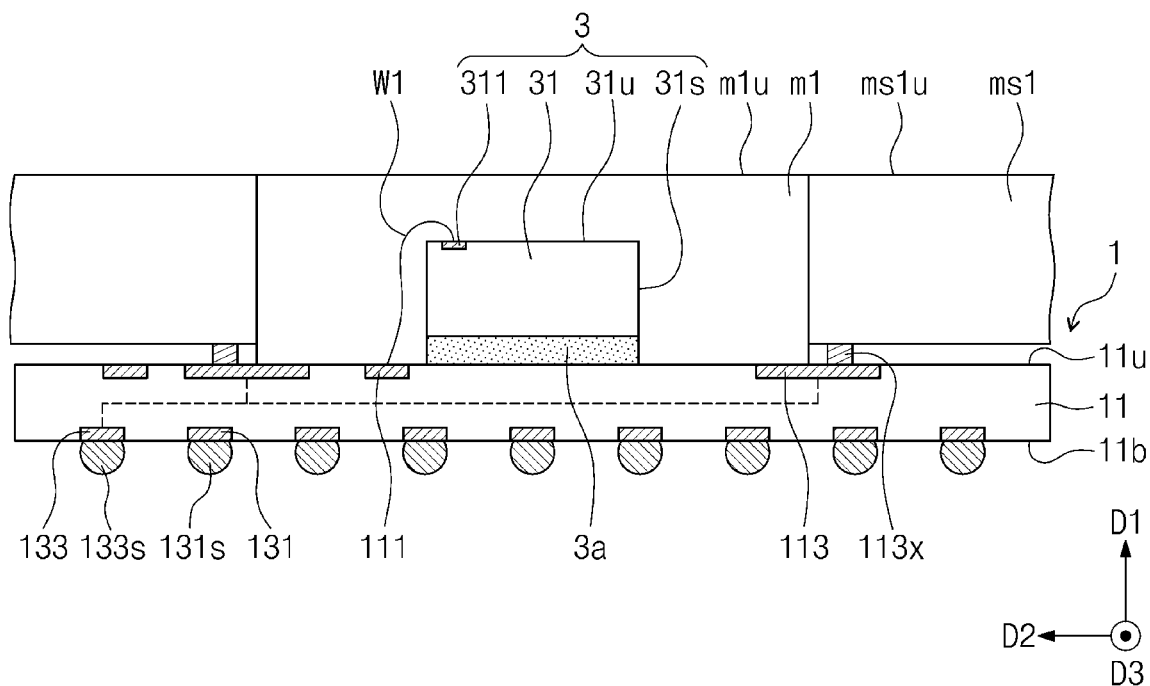

Referring to FIG. 6, the first mask hole ms1*h* may be filled with an EMC or the like, when the first mask ms1 is disposed on the substrate 1. In an embodiment, the EMC may be formed to fill the first mask hole ms1*h* to a level of a top surface ms1*u* of the first mask ms1. However, the inventive concept is not necessarily limited to this example, and the EMC may be formed to cover the top surface ms1*u* of the first mask ms1. The EMC filling the first mask hole ms1*h* may form the inner mold layer m1.

Figure 7:
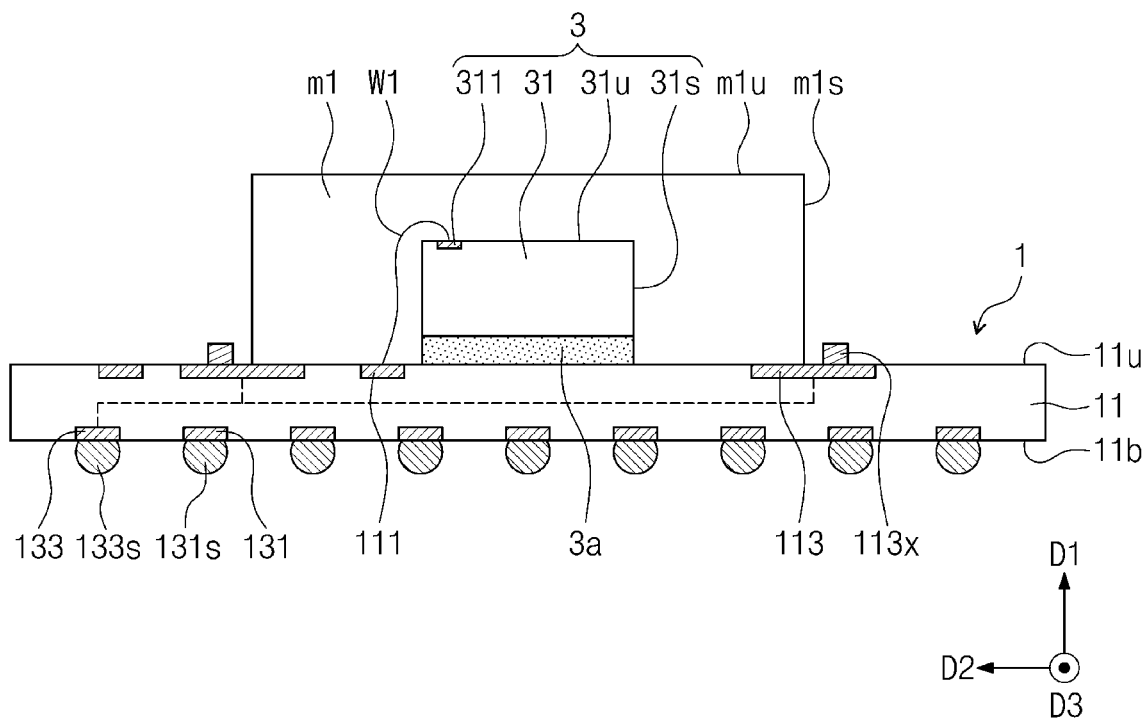

Referring to FIG. 7, the first mask ms1 may be removed from the substrate 1. If the EMC in the first mask hole is cured, the inner mold layer m1 may be fixed on the substrate 1. The inner mold layer m1 may at least partially enclose or cover a side surface 31*s* and a top surface 31*u* of the first semiconductor chip 3.

Figure 8:
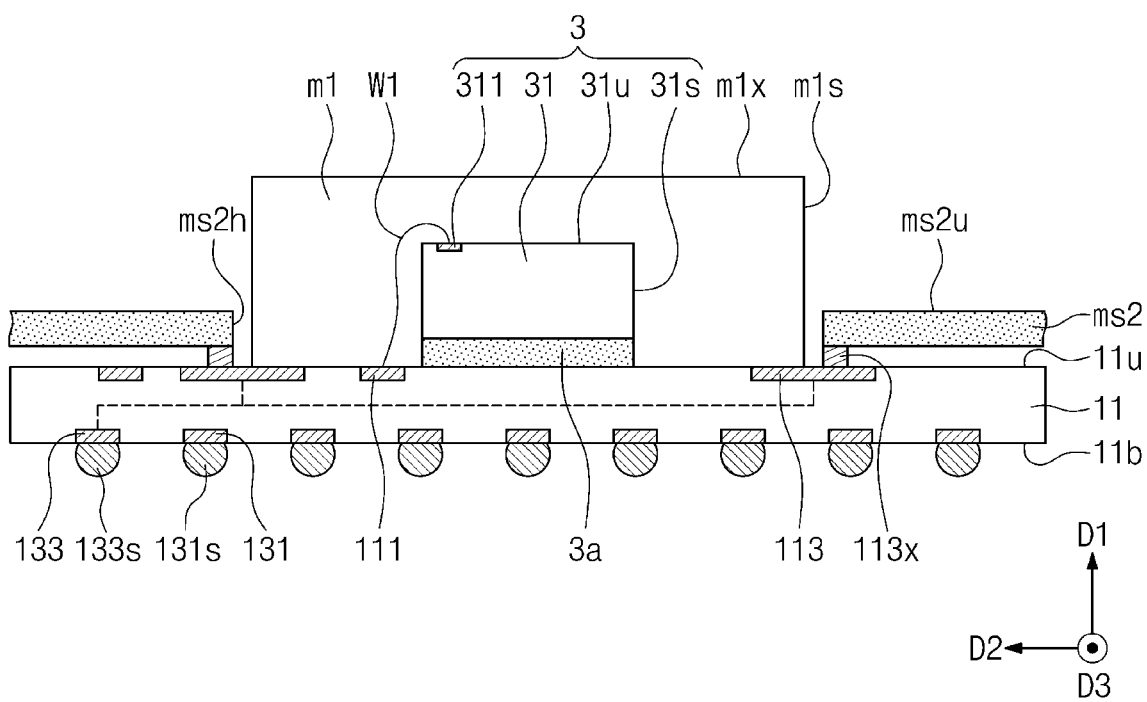

Referring to FIG. 8, the forming of the inner shielding layer (in S3) may include forming a second mask ms2 on the substrate 1. The second mask ms2 may be formed to have a second mask hole ms2*h*. The second mask ms2 may be disposed on the substrate 1 such that the first semiconductor chip 3 and the inner mold layer m1 are within the second mask hole ms2*h*.

Figure 9:
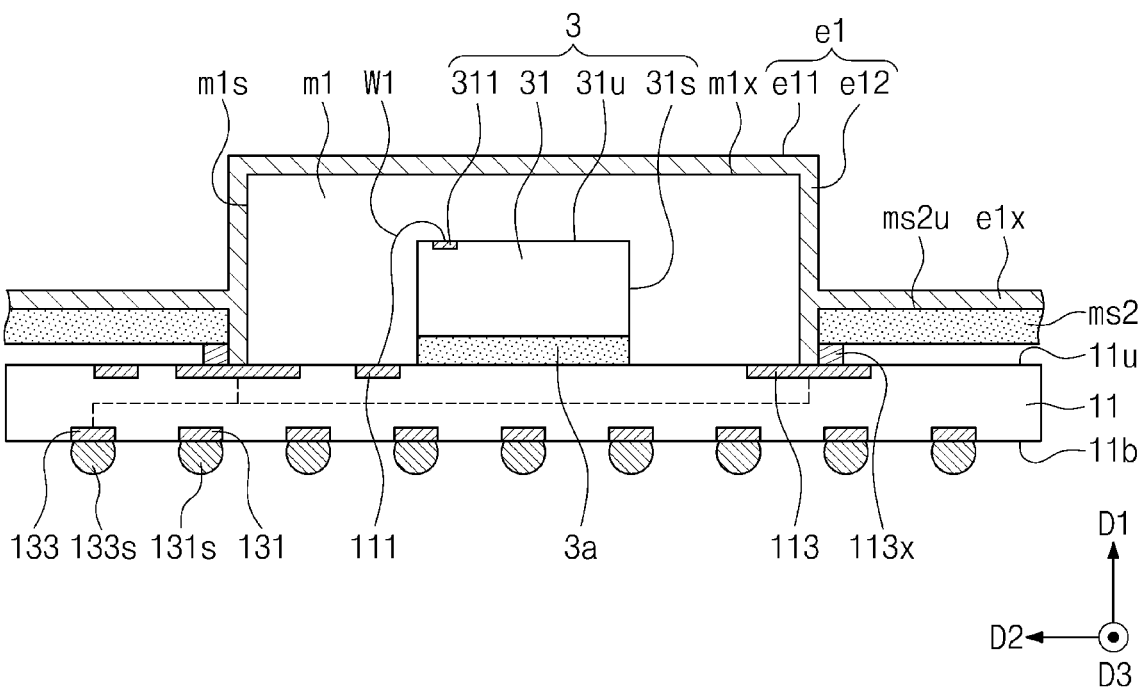

Referring to FIG. 9, a conductive material may be formed on the second mask ms2 and the inner mold layer m1, when the second mask ms2 is disposed on the substrate 1. The conductive material may be formed by various methods. For example, the conductive material may be formed by a coating process, a spray process, a deposition process, a plating process, or the like. In the case where the conductive material includes copper (Cu), the conductive material may be formed by, for example, a chemical vapor deposition (CVD) process or a physical vapor deposition (PVD) process. In the case where the conductive material includes silver (Ag), the conductive material may be formed by, for example, a spray coating process. However, the inventive concept is not necessarily limited to these examples, and the conductive material may comprise other conductive materials, and may be formed by various other deposition processes, an electroplating process, an electroless plating process, or others. The conductive material may be formed to cover a top surface m1*u* and a side surface m1*s* of the inner mold layer m1. The conductive material covering the top surface m1*u* and the side surface m1*s* of the inner mold layer m1 may form the inner shielding layer e1. An upper portion e11 of the inner shielding layer e1 may cover the top surface m1*u* of the inner mold layer m1. A side portion e12 of the inner shielding layer e1 may cover the side surface m1*s* of the inner mold layer m1. A portion e1*x* of the conductive material may be formed to cover a top surface ms2*u* of the second mask ms2.

Figure 10:
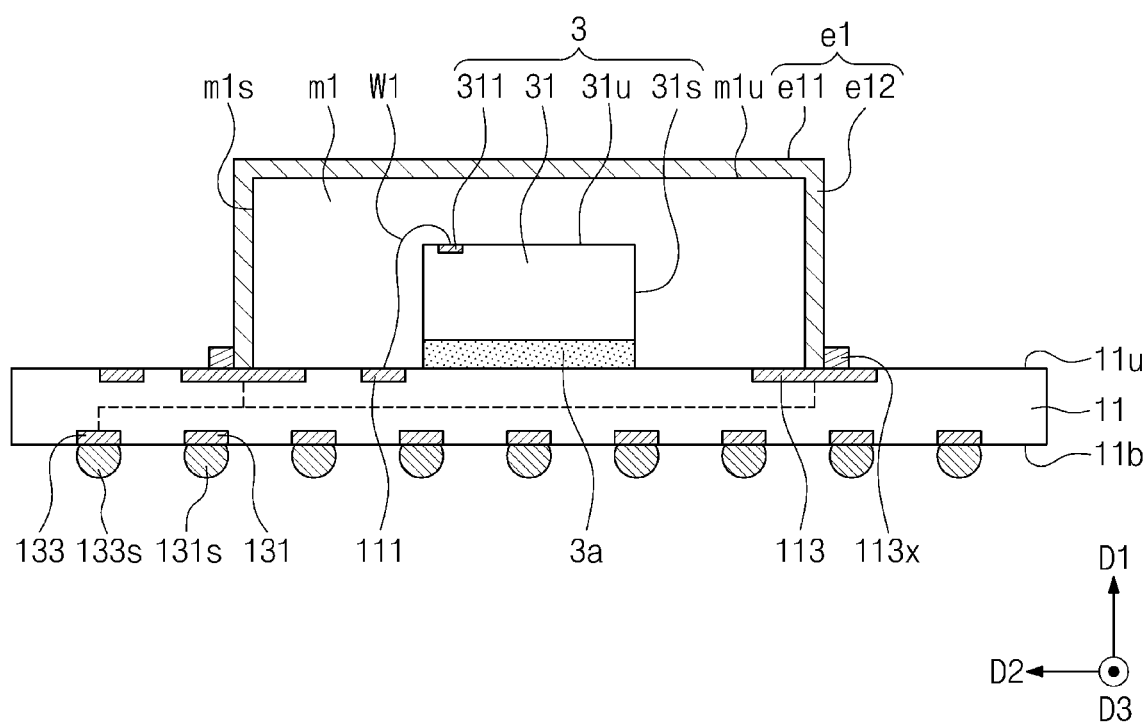

Referring to FIG. 10, the second mask ms2 may be removed from the substrate 1. The conductive material on the second mask ms2 may be removed along with the second mask ms2. As a result, the conductive material covering the inner mold layer m1 may be left to form the inner shielding layer e1. The inner shielding layer e1 may be in contact with the ground dam 113*x*.

Figure 11:
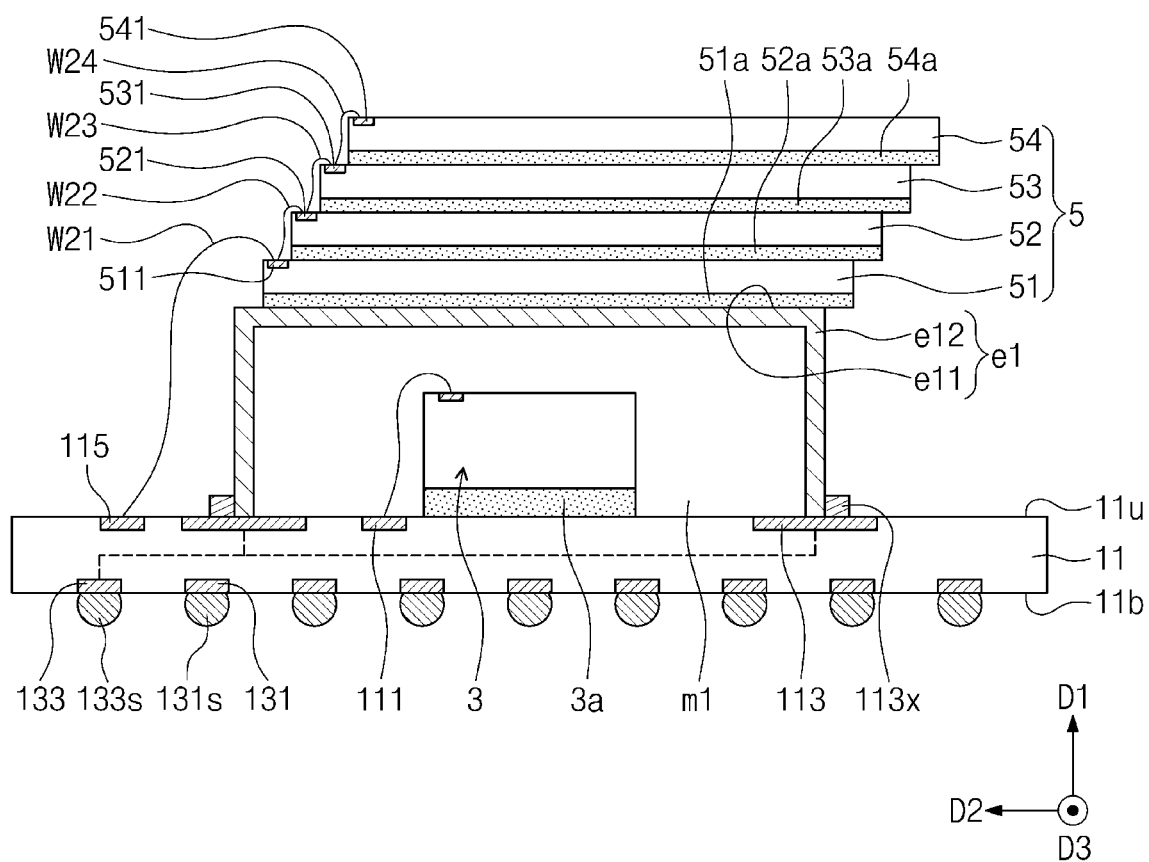

Referring to FIG. 11, the disposing of the second semiconductor chip stack (in S4) may include forming the second semiconductor chip stack 5 on the inner shielding layer e1. In the case where the second semiconductor chip stack 5 includes four memory chips, each memory chip may be bonded to an underlying memory chip or the inner shielding layer e1 by the memory chip bonding layer 51*a*, 52*a*, 53*a*, or 54*a*. In the case where the memory chips are stacked in a stepwise manner, a memory chip pad 511, 521, 531, or 541 of each memory chip may be exposed to the outside. Each memory chip may be electrically connected to the second connection pad 115 through the memory chip pad 511, 521, 531, or 541. For example, the memory chip pads 511, 521, 531, and 541 may be electrically connected to the second connection pad 115 through second wires W21, W22, W23, and W24, but the present inventive concept is not limited thereto. For example, the second semiconductor chip stack 5 may be electrically connected to the substrate 1. Accordingly, the second semiconductor chip stack 5 may be electrically connected to the first semiconductor chip 3 through the substrate 1.

Figure 12:
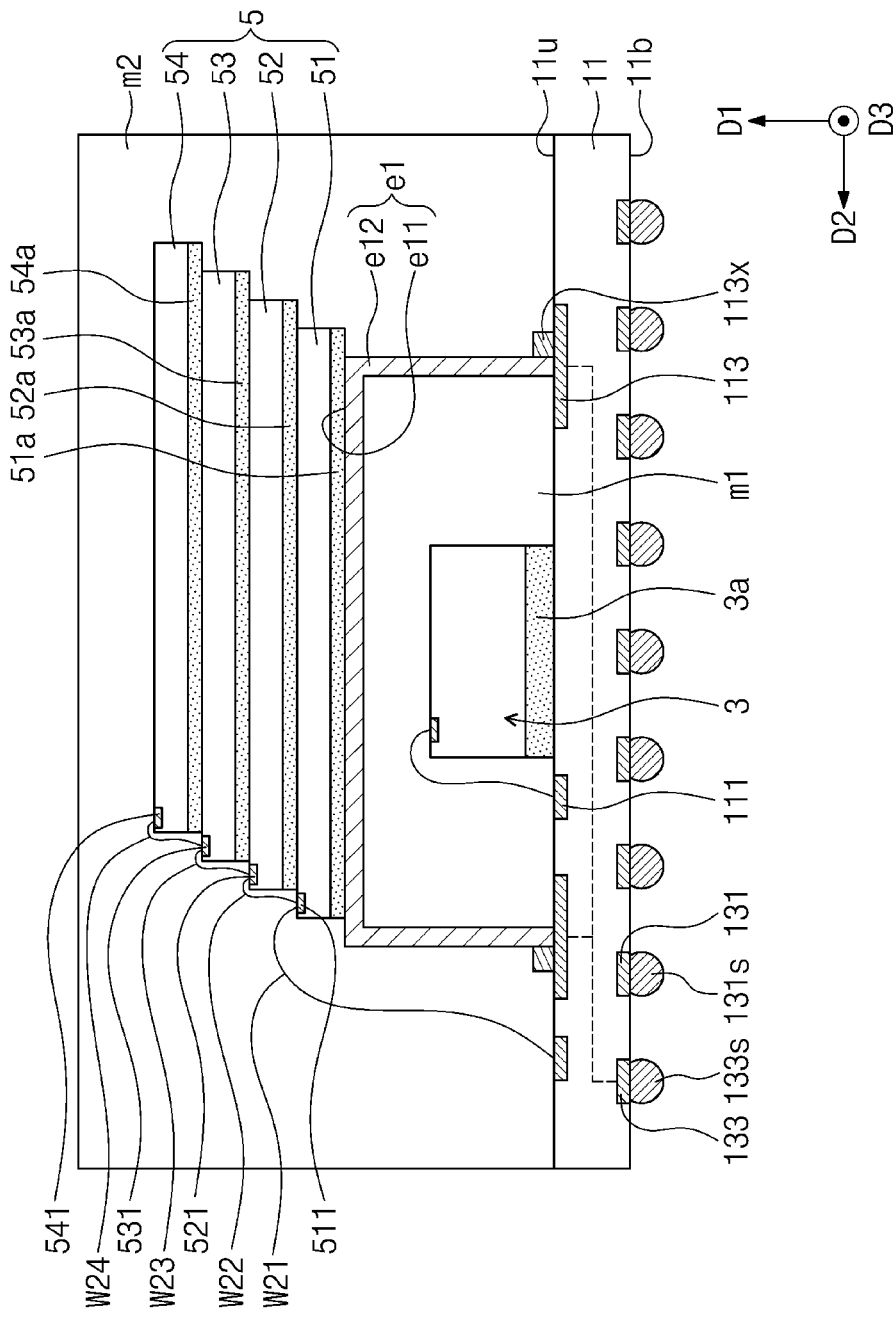

Referring to FIG. 12, the forming of the outer mold layer (in S5) may include forming the outer mold layer m2 to at least partially enclose the inner shielding layer e1 and the second semiconductor chip stack 5. The outer mold layer m2 may be formed through substantially the same or similar method as the method (in S2) described with reference to FIGS. 5 to 7. The outer mold layer m2 may be formed to cover or at least partially enclose the side and top surfaces of the inner shielding layer e1.

The forming of the outer shielding layer (in S6) may include forming the outer shielding layer e2 to at least partially enclose or cover the top and side surfaces of the outer mold layer m2. The outer shielding layer e2 may be formed through substantially the same or similar method as the method (in S3) described with reference to FIGS. 8 to 10. If the forming of the outer shielding layer (in S6) is finished, the semiconductor package P may have substantially the same structure as that shown in FIG. 1. In an embodiment, an EMI shielding tape may be further provided to cover the outer shielding layer, but the inventive concept is not limited to this example.

In a method of fabricating a semiconductor package according to an embodiment of the inventive concept, an inner mold layer covering a first semiconductor chip and an inner shielding layer covering the inner mold layer may be formed before forming an outer mold layer. Thus, the inner shielding layer may be protected by the outer mold layer. For example, the inner shielding layer may be protected from an external impact. That is, it may be possible to prevent the inner shielding layer from being damaged by the external impact. Even when an outer appearance of the semiconductor package is damaged by the external impact, the inner shielding layer may not be damaged. Accordingly, even when the outer appearance of the semiconductor package appears to be damaged, the semiconductor package may still prevent electromagnetic waves generated from the first semiconductor chip from escaping the package and causing EMI.

Figure 13:
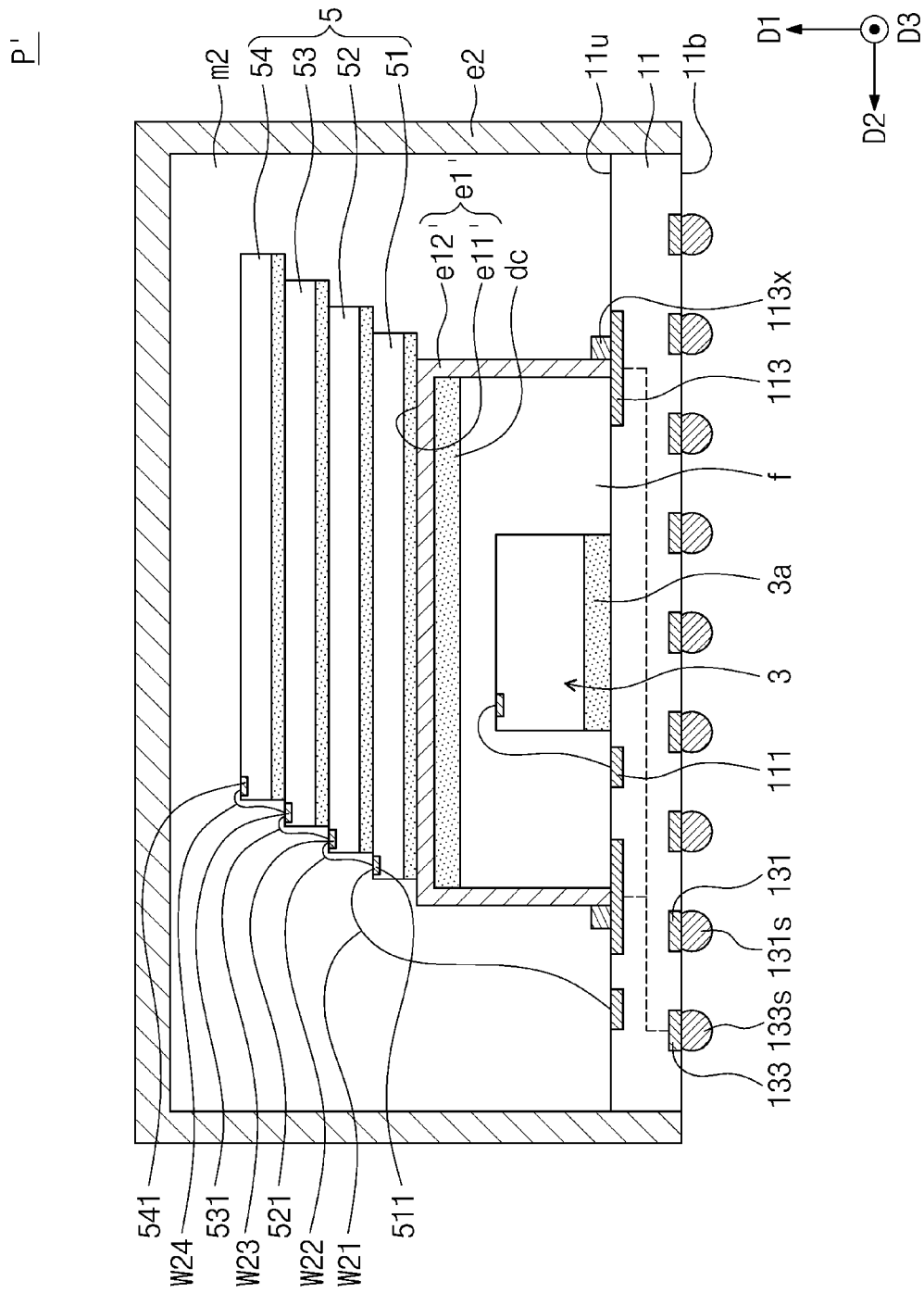
FIG. 13 is a cross-sectional view illustrating a semiconductor package according to an embodiment of the inventive concept.
Figure 14:
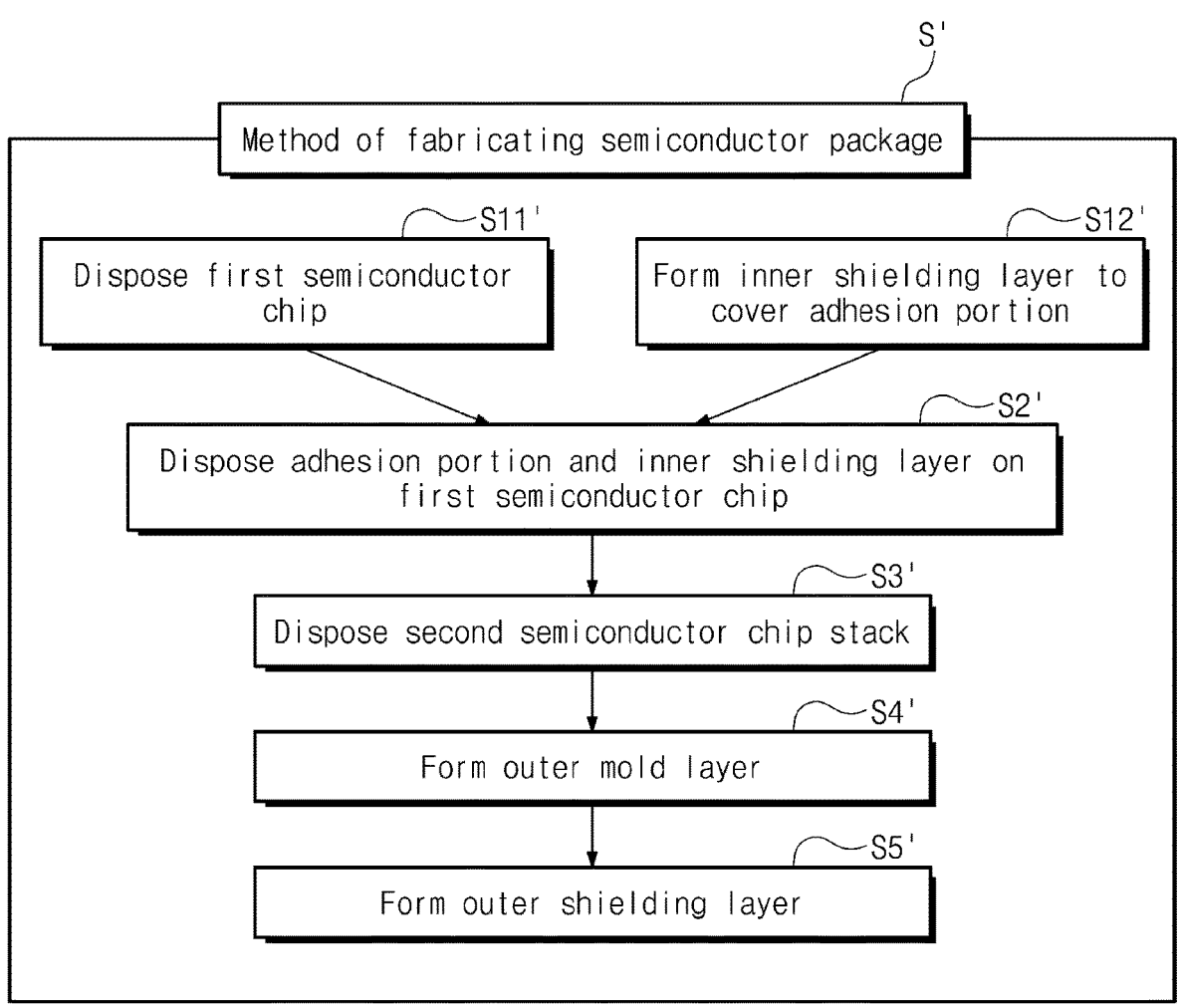
FIG. 14 is a flow chart illustrating a method of fabricating a semiconductor package, according to an embodiment of the inventive concept.

FIG. 13 is a cross-sectional view illustrating a semiconductor package according to an embodiment of the inventive concept, and FIG. 14 is a flow chart illustrating a method of fabricating a semiconductor package, according to an embodiment of the inventive concept.

For concise description, an element previously described with reference to FIGS. 1A to 12 may be identified by the same reference number without repeating an overlapping description thereof.

Referring to FIG. 13, an adhesion portion f may be provided to at least partially enclose the first semiconductor chip 3. The adhesion portion f may protect the first semiconductor chip 3. In an embodiment, the adhesion portion f may include a film-on-die (FOD) or the like. Additionally or alternatively, the adhesion portion f may be formed of or include an insulating polymer or the like. A supporting layer dc may be disposed on the adhesion portion f. In an embodiment, the supporting layer dc may include a dummy chip or the like. Additionally or alternatively, the supporting layer dc may be a spacer. For example, the supporting layer dc may include non-conductive materials. For example, the supporting layer dc may be formed of or include silicone-based insulating materials, polymer block, or the like. The supporting layer dc may not be electrically connected to the first semiconductor chip 3, the substrate 1, and/or the second semiconductor chip stack 5. However, the inventive concept is not necessarily limited to this example, and in an embodiment, the supporting layer dc may include a memory chip or the like, and additionally or alternatively, be connected to the first semiconductor chip 3 or the substrate 1. The adhesion portion f may have an upper surface area that is substantially equal or similar to that of the supporting layer dc. For example, the adhesion portion f and the supporting layer dc may have the same or similar area, when viewed in a plan view. An inner shielding layer e1' may be provided to at least partially enclose the adhesion portion f and the supporting layer dc.

Referring to FIG. 14, a method S' of fabricating a semiconductor package may include disposing a first semiconductor chip (in S11'), forming an inner shielding layer to cover an adhesion portion (in S12'), disposing the adhesion portion and the inner shielding layer on the first semiconductor chip (in S2'), disposing a second semiconductor chip stack (in S3'), forming an outer mold layer (in S4'), and forming an outer shielding layer (in S5'). Hereinafter, each step of the method S' will be described in more detail with reference to FIGS. 15 to 18.

FIGS. 15 to 18 are cross-sectional views sequentially illustrating fabricating steps in the method of FIG. 14.

Referring to FIG. 15, the adhesion portion f may be placed below the supporting layer dc. The upper surface shape of the supporting layer dc may substantially match the upper surface shape of the adhesion portion f such that the inner shielding layer e1' (e.g., see FIG. 16) is formed on the adhesion portion f.

Referring to FIGS. 14 and 16, the forming of the inner shielding layer to cover the adhesion portion (in S12') may include forming the inner shielding layer e1' on the supporting layer dc and the adhesion portion f. The inner shielding layer e1' may be formed to at least partially enclose the supporting layer dc and the adhesion portion f. For example, the inner shielding layer e1' may be formed to cover the top and side surfaces of the supporting layer dc and the side surface of the adhesion portion f. An upper portion e11' of the inner shielding layer e1' may be in contact with the top surface of the supporting layer dc. A side portion e12' of the inner shielding layer e1' may cover or at least partially enclose a side surface of the supporting layer dc and a side surface of the adhesion portion f. In an embodiment, the inner shielding layer e1' may be formed by various methods. For example, the inner shielding layer e1' may be formed by a coating process, a spray process, a deposition process, a plating process, or the like, but the present inventive concept is not necessarily limited thereto. In the case where the inner shielding layer e1' includes copper (Cu), the inner shielding layer e1' may be formed by, for example, a chemical vapor deposition (CVD) process or a physical vapor deposition (PVD) process. In the case where the inner shielding layer e1' includes silver (Ag), the inner shielding layer e1' may be formed by, for example, a spray coating process. However, the inventive concept is not necessarily limited to this example, and the inner shielding layer e1' may comprise other conductive materials, and may be formed by various other deposition processes, an electroplating process, an electroless plating process, or others.

Figure 17:
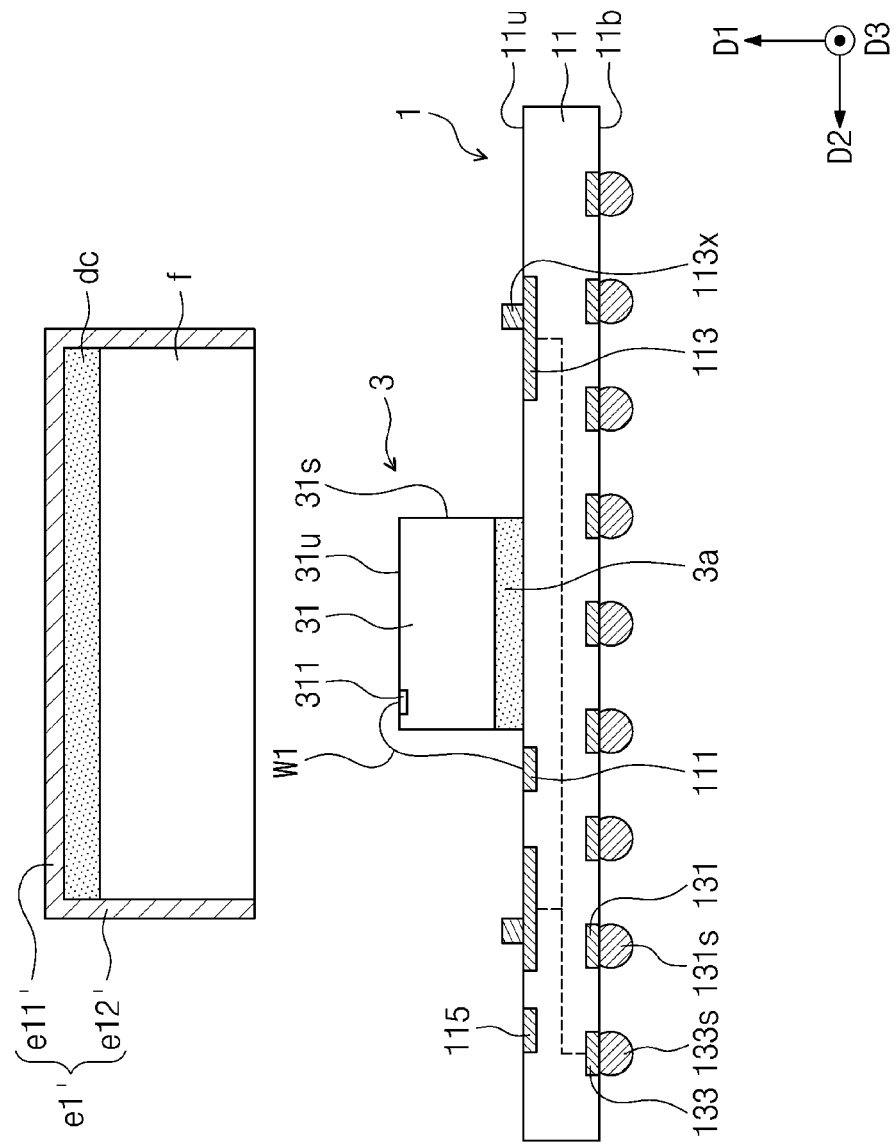
Figure 18:
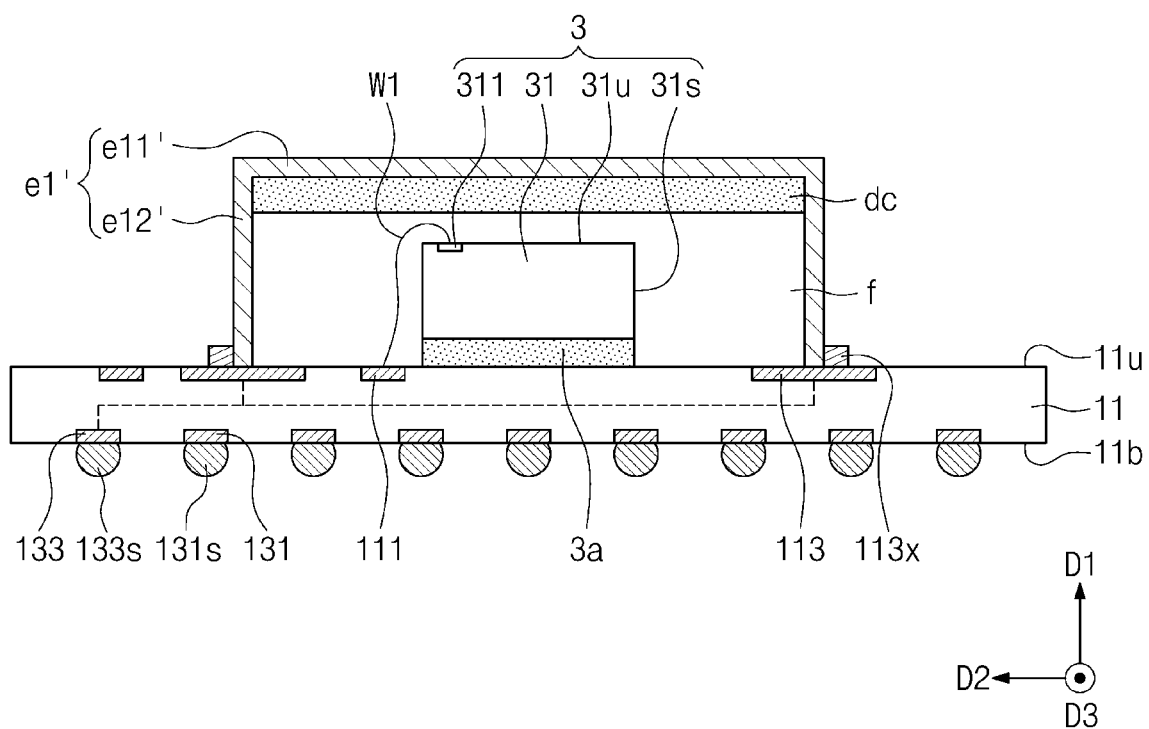

Referring to FIGS. 14, 17, and 18, the disposing of the adhesion portion and inner shielding layer on the first semiconductor chip (in S2') may include downwardly pressing the adhesion portion f and the inner shielding layer e1' against the substrate 1. A portion of the adhesion portion f may be compressed by the first semiconductor chip 3. The adhesion portion f may at least partially enclose the first semiconductor chip 3. If the adhesion portion f is disposed on the substrate 1, the adhesion portion f may be fixed on the substrate 1 by a curing process.

Figure 19:
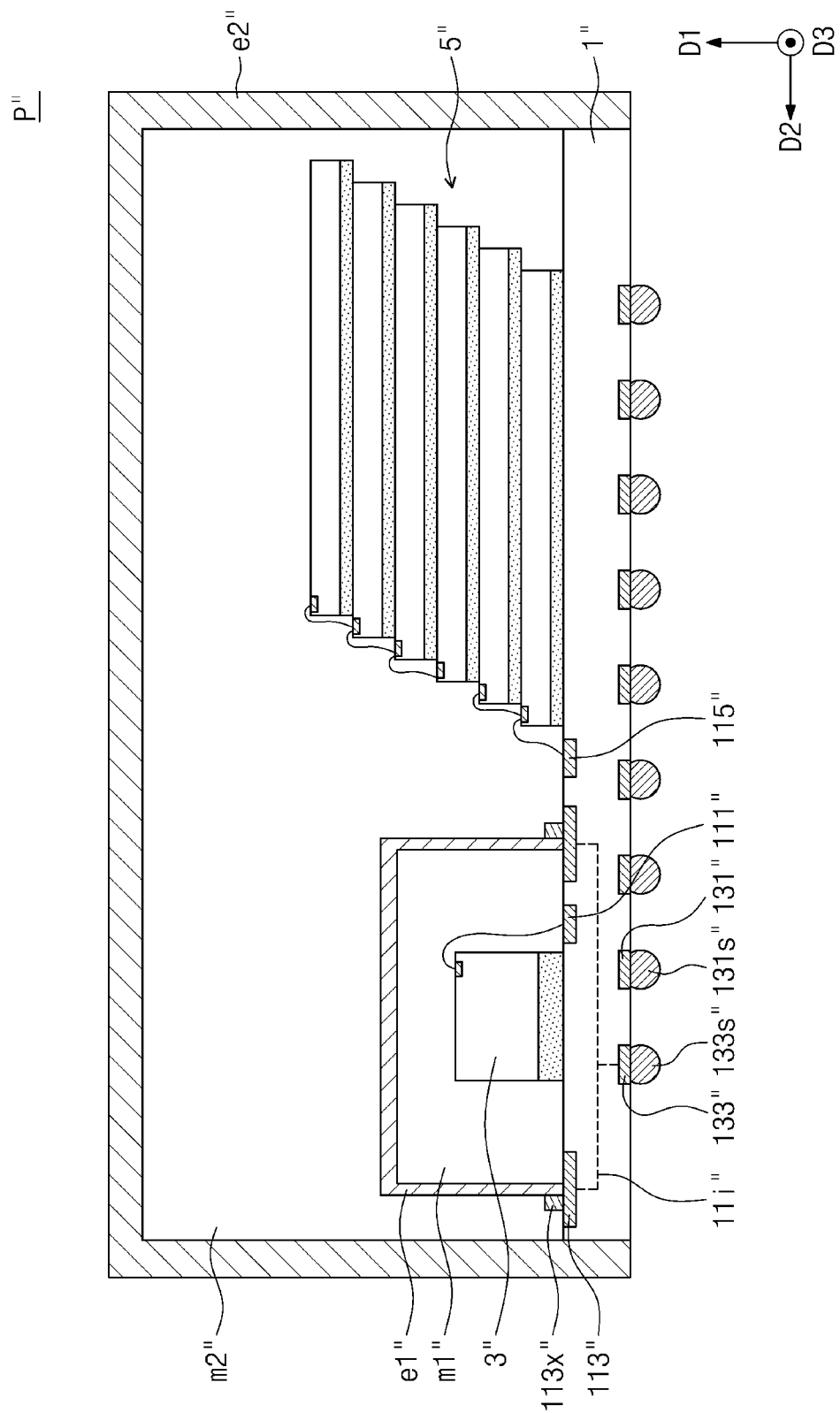
FIG. 19 is a cross-sectional view illustrating a semiconductor package according to an embodiment of the inventive concept.

FIG. 19 is a cross-sectional view illustrating a semiconductor package according to example embodiments of the inventive concept.

For concise description, an element previously described with reference to FIGS. 1A to 18 may be identified by the same reference number without repeating an overlapping description thereof.

Referring to FIG. 19, a semiconductor package P''' may include a substrate 1''', a first semiconductor chip 3''', an inner mold layer m1''', an inner shielding layer e1''', a second semiconductor chip stack 5''', an outer mold layer m2''', and an outer shielding layer e2'''. In the semiconductor package P''' of FIG. 19, the first semiconductor chip 3''' and the second semiconductor chip stack 5''' may be spaced apart from each other in a horizontal direction, unlike the structure described with reference to FIG. 1. For example, the second semiconductor chip stack 5" may not be placed on the inner shielding layer e1". The first semiconductor chip 3" and the second semiconductor chip stack 5" may be electrically connected to each other through the substrate 1". The second semiconductor chip stack 5" may be electrically connected to the substrate 1" through wires or the like, as shown in FIG. 19, but the inventive concept is not necessarily limited to this example. For example, the second semiconductor chip stack 5" may be electrically connected to the substrate 1" using through-silicon vias (TSVs).

In the semiconductor package and the method thereof according to an embodiment of the inventive concept, it may be possible to prevent or suppress electromagnetic waves from being emitted to the outside of the package.

In the semiconductor package and the method thereof according to an embodiment of the inventive concept, it may be possible to prevent deterioration of a production yield by damage of an outer appearance of the package.

In the semiconductor package and the method thereof according to an embodiment of the inventive concept, it may be possible to prevent semiconductor chips in the semiconductor package from interfering with each other by electromagnetic waves.

While embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
    a substrate;
    a first semiconductor chip disposed on the substrate;
    an adhesion portion at least partially enclosing the first semiconductor chip;
    a supporting layer disposed on the adhesion portion;
    an inner shielding layer at least partially enclosing the adhesion portion and the supporting layer;
    a second semiconductor chip disposed on the inner shielding layer;
    an outer mold layer at least partially enclosing both the inner shielding layer and the second semiconductor chip;
    an outer shielding layer at least partially enclosing the outer mold layer; and
    a ground dam directly contacting a side surface of the inner shielding layer, wherein the side surface of the inner shielding layer is substantially perpendicular to an upper surface of the substrate,
    wherein each of the inner and outer shielding layers comprises a conductive material,
    wherein the inner shielding layer is electrically connected to the substrate by a ground pad, and
    wherein the first semiconductor chip comprises a semiconductor chip of a different type from the second semiconductor chip.

2. The semiconductor package of claim 1, wherein the supporting layer comprises a dummy chip.

3. The semiconductor package of claim 1, wherein the adhesion portion comprises a film-on-die (FOD).

4. The semiconductor package of claim 1, wherein the ground dam is disposed on the ground pad,
    wherein the ground dam comprises a conductive material and is electrically connected to the ground pad, and
    wherein the side surface of the inner shielding layer is in contact with a side surface of the ground dam.

5. The semiconductor package of claim 4, wherein the ground dam at least partially encloses the inner shielding layer.

6. The semiconductor package of claim 1, wherein the first semiconductor chip is electrically connected to the second semiconductor chip through the substrate.

7. The semiconductor package of claim 1, wherein the first semiconductor chip comprises a logic chip, and
    wherein the second semiconductor chip comprises a memory chip.

* * * * *